US011837798B2

(12) United States Patent
Moates

(10) Patent No.: US 11,837,798 B2
(45) Date of Patent: Dec. 5, 2023

(54) LOW-PROFILE MEDIUM WAVE TRANSMITTING SYSTEM

(71) Applicant: Worldwide Antenna Systems LLC, Kingston, MA (US)

(72) Inventor: Grady Moates, Brockton, MA (US)

(73) Assignee: Worldwide Antenna Systems LLC, Kingston, MA (US)

( * ) Notice: Subject to any disclaimer, the term of this patent is extended or adjusted under 35 U.S.C. 154(b) by 1031 days.

(21) Appl. No.: 16/580,783

(22) Filed: Sep. 24, 2019

(65) Prior Publication Data

US 2020/0106175 A1 Apr. 2, 2020

Related U.S. Application Data

(60) Provisional application No. 62/737,180, filed on Sep. 27, 2018.

(51) Int. Cl.
*H01Q 3/44* (2006.01)
*H01Q 13/28* (2006.01)
(Continued)

(52) U.S. Cl.
CPC ............. *H01Q 3/44* (2013.01); *H01Q 3/28* (2013.01); *H01Q 13/28* (2013.01);
(Continued)

(58) Field of Classification Search
CPC ............ H01Q 3/44; H01Q 3/28; H01Q 13/28; H01Q 9/36; H01Q 9/40; H01Q 21/28;
(Continued)

(56) References Cited

U.S. PATENT DOCUMENTS 5,155,495 A 10/1992 Hatley et al.
6,025,813 A 2/2000 Hatley/ et al.
(Continued)

FOREIGN PATENT DOCUMENTS

GB 2 215 524 A 9/1989
GB 2 330 695 A 4/1999
GB 2 387 969 A 10/2003

OTHER PUBLICATIONS

India Patent Office, First Examination Report, Application No. 202117012994, dated Dec. 6, 2022, 5 pages.

*Primary Examiner* — Lana N Le
(74) *Attorney, Agent, or Firm* — Sunstein LLP

(57) ABSTRACT

Techniques for controlling a low-profile medium wave transmitting system are provided. An example of an antenna system according to the disclosure includes a first radiator operably coupled to a first amplifier, a first modulator operably coupled to the first amplifier and configured to provide a first radio frequency signal to the first amplifier, a second radiator operably coupled to a second amplifier, a second modulator operably coupled to the second amplifier and configured to provide a second radio frequency signal to the second amplifier, a control module operably coupled to the first modulator, first amplifier, the second modulator, and the second amplifier, the control module being configured to control a delta phase value based on the first radio frequency signal and the second radio frequency signal, and control the power output of the first amplifier and the second amplifier.

8 Claims, 9 Drawing Sheets

(51) Int. Cl.
*H03F 3/21* (2006.01)
*H03F 3/193* (2006.01)
*H03F 1/02* (2006.01)
*H04B 1/04* (2006.01)
*H01Q 3/28* (2006.01)
*H03F 3/195* (2006.01)

(52) U.S. Cl.
CPC ......... *H03F 1/0205* (2013.01); *H03F 1/0211* (2013.01); *H03F 3/193* (2013.01); *H03F 3/195* (2013.01); *H03F 3/21* (2013.01); *H04B 1/0458* (2013.01); *H04B 1/0483* (2013.01)

(58) Field of Classification Search
CPC ...... H03F 1/0205; H03F 1/0211; H03F 3/193; H03F 3/195; H03F 3/21; H04B 1/0458; H04B 1/0483; H04B 10/516; H04B 10/548; H04B 10/541; H04B 1/40; H04B 10/50; H04B 1/00; H04B 1/406; H04B 10/5563; H04B 17/10; H04L 27/0008; H04L 27/2601; H04L 1/0003; H04L 1/0041; H04L 27/364; H04L 25/03343; H04L 27/12; H04L 27/20; H04L 27/365; H04L 27/2092; H04L 1/009; H04L 27/2636; H04L 27/2697; H04L 27/00; H04L 27/36; G06F 15/00
See application file for complete search history.

(56) References Cited

U.S. PATENT DOCUMENTS

| | | | |
|---|---|---|---|
| 6,829,469 B1 * | 12/2004 | Henriksson | H04B 1/40 |
| | | | 455/119 |
| 7,113,138 B2 | 9/2006 | Hatley et al. | |
| 8,957,822 B2 | 2/2015 | Mendenhall | |
| 9,647,326 B1 | 5/2017 | Gorman | |
| 9,685,982 B2 * | 6/2017 | Zhu | H04B 1/0483 |
| 10,135,143 B2 | 11/2018 | Gorman | |
| 10,312,567 B2 * | 6/2019 | Bennett | H04B 1/00 |
| 10,819,035 B2 * | 10/2020 | Wolniansky | H01Q 13/28 |
| 11,632,273 B1 * | 4/2023 | Rezk | H04L 25/03343 |
| | | | 375/267 |
| 2013/0278473 A1 | 10/2013 | Bowers et al. | |
| 2017/0222322 A1 | 8/2017 | Gorman | |
| 2018/0007645 A1 * | 1/2018 | Khlat | H03F 3/195 |
| 2019/0157757 A1 * | 5/2019 | Murakowski | H01Q 21/0025 |
| 2019/0222181 A1 * | 7/2019 | Khlat | H03F 3/189 |
| 2019/0386621 A1 * | 12/2019 | Alon | H03F 1/0227 |

* cited by examiner

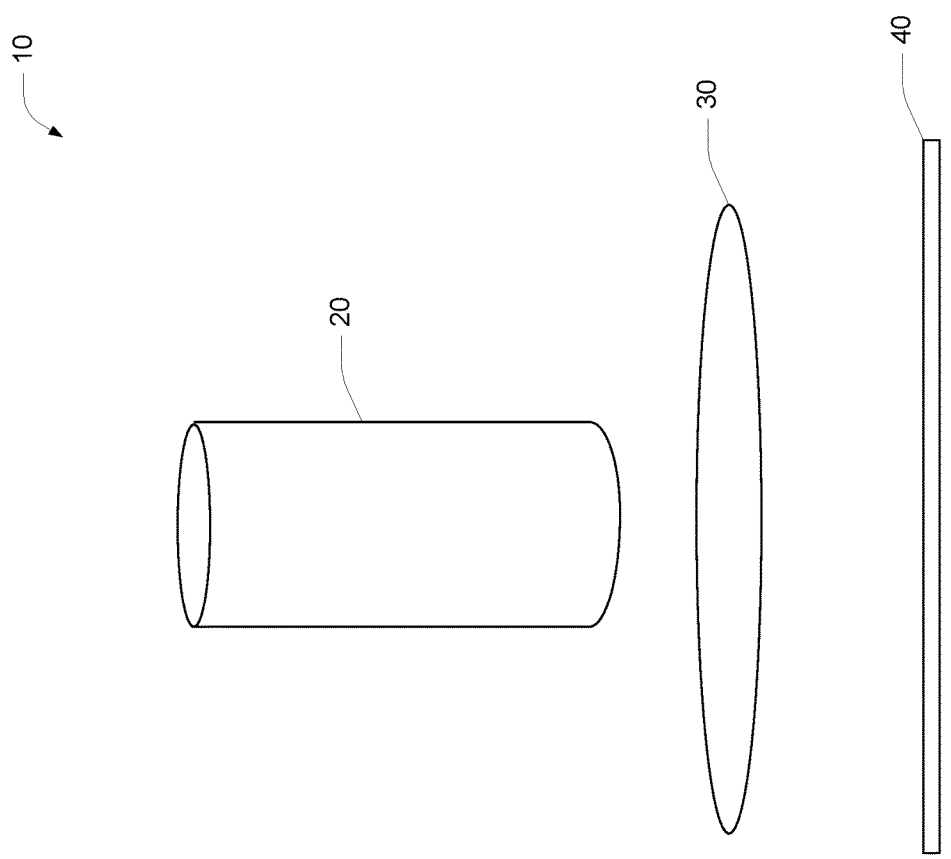

LOW-PROFILE MEDIUM WAVE TRANSMITTING SYSTEM

CROSS-REFERENCE TO RELATED APPLICATIONS

This application claims the benefit of U.S. Provisional Application No. 62/737,180, filed Sep. 27, 2018, entitled "Low-Profile Medium Wave Transmitting System," the entire contents of which are hereby incorporated herein by reference.

TECHNICAL FIELD

This application relates to crossed-field radio-frequency antennas.

BACKGROUND

Standard commercial broadcast systems typically require a substantial amount of land to support a vertical antenna and the associated guy wires. A low-profile antenna system attempts to provide similar levels for power output while using only a fraction of the land required for a standard system. For example, a crossed-field antenna ("CFA") is a type of antenna designed for long and medium wave broadcasting with a reduced geographical footprint as compared to vertical antenna configurations. Conventional CFAs were first developed by Hately & Kabbary (see U.S. Pat. No. 5,155,495, issued 13 Oct. 1992; U.S. Pat. No. 6,025,813, issued 15 Feb. 2000; and U.S. Pat. No. 7,113,138, issued 26 Sep. 2006). These authors describe an antenna with two parts, one of which produces a high frequency electric field, and the other of which produces a high frequency magnetic field. The electric and magnetic field lines are arranged to cross, and thereby synthesize and propagate radio waves.

Such CFAs were touted as a highly efficient antenna design that uses far less height than conventional antennas. Although there was initial excitement about such antennas in the 1980s and early 1990s, the efficiency of prior art designs, based on real-world testing, did not live up to the initial expectations. Because these initial CFA designs were not as efficient as initially expected, there is a need for a design that retains the size advantages of a conventional CFA, but is capable of high efficiency for its size.

SUMMARY

An example of an antenna system according to the disclosure includes a first radiator operably coupled to a first amplifier, a first modulator operably coupled to the first amplifier and configured to provide a first radio frequency signal to the first amplifier, a second radiator operably coupled to a second amplifier, a second modulator operably coupled to the second amplifier and configured to provide a second radio frequency signal to the second amplifier, a control module operably coupled to the first modulator, first amplifier, the second modulator, and the second amplifier, the control module being configured to control a delta phase value based on the first radio frequency signal and the second radio frequency signal, and control the power output of the first amplifier and the second amplifier.

Implementations of such an antenna system may include one or more of the following features. The first radiator may be an E-cylinder and the second radiator may be a D-plate. The delta phase value may be approximately 90 degrees. At least one far field sensor may be configured to provide far field signal information to the control module. The far field signal information may be an E-field signal strength measurement. The far field signal information may be an H-field signal strength measurement. The at least one far field sensor may be configured to provide at least one environmental variable value. The antenna system may further include a third radiator operably coupled to a third amplifier, a third modulator operably coupled to the third amplifier and configured to provide a third radio frequency signal to the third amplifier, the control module being operably coupled to the third modulator and the third amplifier and configured to control the power output and the relative phase of the third amplifier.

An example method of tuning a two amplifier antenna feed network according to the disclosure includes providing a first radio frequency input with a first amplifier to a first radiator circuit comprising a first network filter and an E-cylinder, providing a second radio frequency input with a second amplifier to a second radiator circuit comprising a second filter network and a D-plate, adjusting the first radio frequency input and the second radio frequency input such that an amplitude of the first radio frequency input and an amplitude of the second radio frequency input are approximately equal and a phase of the first radio frequency input and a phase of the second radio frequency input vary by approximately 90 degrees, and increasing the power output of the first amplifier and the power output of the second amplifier.

Implementations of such a method may include one or more of the following features. The first filter network may be adjusted to reduce an electrical strain on the first amplifier, and the second filter network may be adjusted to reduce an electrical strain on the second amplifier. Increasing the power output of the first amplifier and the power output of the second amplifier may include providing a first power control signal to the first amplifier and a second power control signal to the second amplifier. The first power control signal may be based on a first amplifier value received from a remote server, and the second power control signal may be based on a second amplifier value received from the remote server. Far field signal quality information may be received, such that increasing the power output of the first amplifier and the power output of the second amplifier is based at least in part on the far field signal quality information. At least one environmental variable value may be received, such that increasing the power output of the first amplifier and the power output of the second amplifier is based at least in part on the at least one environmental variable value.

An example of a method for tuning a low-profile medium wave antenna according to the disclosure includes determining far field signal quality information for the low-profile medium wave transmitter, determining a first amplifier power value, a second amplifier power value, and a delta phase value for the low-profile medium wave transmitter, wherein the first amplifier value is associated with a first signal provided to a first radiator, the second amplifier value is associated with a second signal provided to a second radiator, and the delta phase value is based upon a comparison of the phase of the first signal with the phase of the second signal, providing the far field signal quality information, the first amplifier power value, the second amplifier power value, and the delta phase value to a remote server, receiving an updated first amplifier power value, an updated second amplifier value, and an updated delta phase value from the remote server, and tuning the low-profile medium wave transmitter based on the updated first amplifier power value, the updated second amplifier value, and the updated delta phase value.

Implementations of such a method may include one or more of the following features. At least one environmental variable value may be determined, and the at least one environmental variable may be provided to the remote server.

An example of a tuning network according to the disclosure includes a first one low-profile medium wave antenna including an E-cylinder operably coupled to an E-cylinder amplifier, and a D-plate operably coupled to a D-plate amplifier, a remote computer operably coupled to the first low-profile medium wave antenna and configured to provide at least a first radio frequency signal to the E-cylinder amplifier and a second radio frequency signal to the D-plate amplifier, and at least one far field sensor configured to provide far field signal quality information to the remote computer.

Implementations of such a tuning network may include one or more of the following features. A second one low-profile medium wave antenna including an E-cylinder may be operably coupled to an E-cylinder amplifier, and a D-plate may be operably coupled to a D-plate amplifier, and the remote computer may be operably coupled to the second low-profile medium wave antenna and configured to provide at least a third radio frequency signal to the E-cylinder amplifier and a fourth radio frequency signal to the D-plate amplifier. A remote server may be operably coupled to the remote computer, the remote server may be configured to store tuning parameters associated with one or more low-profile medium wave antenna systems. The tuning parameters may include a first amplifier value, a second amplifier value, and a delta phase value.

An example of a single-frequency directional amplitude modulation antenna system according to the disclosure includes a first radiator operably coupled to a first amplifier, a first modulator operably coupled to the first amplifier and configured to provide a first radio frequency signal to the first amplifier, a second radiator operably coupled to a second amplifier, a second modulator operably coupled to the second amplifier and configured to provide a second radio frequency signal to the second amplifier, a third radiator operably coupled to a third amplifier, a third modulator operably coupled to the third amplifier and configured to provide a third radio frequency signal to the third amplifier, a fourth radiator operably coupled to a fourth amplifier, a fourth modulator operably coupled to the fourth amplifier and configured to provide a fourth radio frequency signal to the fourth amplifier, a control module operably coupled to the first modulator, the first amplifier, the second modulator, the second amplifier, the third modulator, the third amplifier, the fourth modulator, and the fourth amplifier, the control module being configured to control a first delta phase value based on the first radio frequency signal and the second radio frequency signal control the power output of the first amplifier and the second amplifier, control a second delta phase value based on the third radio frequency signal and the fourth radio frequency signal, and control the power output of the third amplifier and fourth second amplifier.

Implementation of such a single-frequency directional amplitude modulation antenna system may include one or more of the following features. The first radiator and the third radiator may be E-cylinders, and the second radiator and the fourth radiator may be D-plates. The control module may be configured to control the power output of the first amplifier, the second amplifier, the third amplifier and the fourth amplifier to increase a signal strength of the single-frequency in a direction. The direction may correspond to a compass azimuth. The control module may be configured to control the power output of the first amplifier, the second amplifier, the third amplifier and the fourth amplifier to decrease a signal strength of the single-frequency in a direction.

Items and/or techniques described herein may provide one or more of the following capabilities, as well as other capabilities not mentioned. A control system is configured to control the phase and amplitude of a radio frequency signal in an antenna system. The control system is operably coupled to at least a first amplifier and a second amplifier. Each of the amplifiers is connected to a respective first radiator network and a second radiator network in the antenna system. The first radiator network may include an E-cylinder and the second radiator may be a D-plate. The control module is configured to control the phase difference (e.g., delta phase) of the radio frequency signals on the first and second radiator networks. One or more field sensors may provide field measurements associated with the transmitted radio frequency signal to the control system. The field measurements may include measurements of environmental variables. The control system may be configured to modify the antenna tuning parameters such as the power and delta phase of the signals on the first and second radiator networks based on the field measurements. The control system may be configured to control a plurality of antenna systems operating at the same radio frequency or at different radio frequencies. The control system may be configured to send and receive antenna tuning parameters and field measurements to a remote server. The remote server may be configured to determine and store antenna tuning parameters based on information received from a plurality of control systems. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

BRIEF DESCRIPTION OF THE DRAWINGS

FIG. 1A is a conceptual diagram of an example cross-field antenna.

DETAILED DESCRIPTION

Figure 1B:
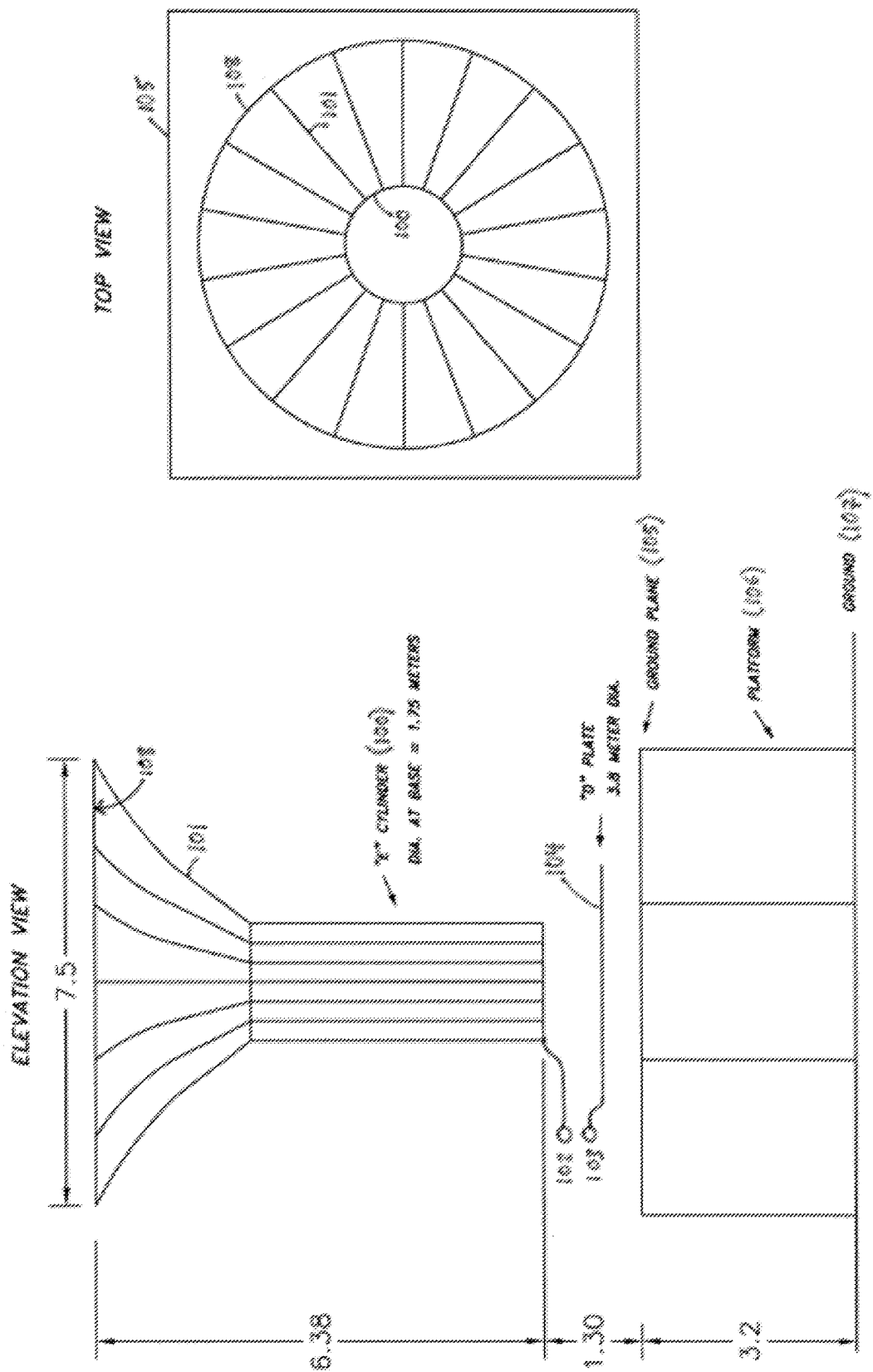
FIG. 1B is a drawing illustrating an example low-profile medium wave antenna, including an elevation view and top view.

The present disclosure describes a low-profile medium wave transmitting system. Standard commercial broadcast systems typically require a substantial amount of land to support a vertical antenna and the associated guy wires. A low-profile antenna system attempts to provide similar levels for power output while using only a fraction of the land required for a standard system. For example, Multi-Element, Low-Profile Medium Wave (ME LP MW) antennas are designed to generate an Electric Field (E-Field) and the Magnetic Field (H-Field) separately, in such a way that the normal 90-degree quadrature Electro-Magnetic Wave is created at some distance from the driven elements, a few electrical wavelengths away from the antenna array. These antenna designs (referred to in this document as ME LP EH antennas) require that the drive-point signals of the E and H elements be maintained in quadrature with each other (90 electrical degrees apart in time). That is, the phase of the Radio Frequency (RF) drive to one element must be 90-degrees advanced with respect to the phase of the RF drive to the other element.

In an example found in standard directional AM antenna systems using vertical radiators, the power and relative phase angle of the signals delivered to each tower may be maintained using lumped-constant inductor and capacitor networks. In such a configuration, however, the spacing between the elements in such an antenna system may be a large portion of a single wavelength at the operating frequency of the system, at least 25% of a single wavelength. In this physical arrangement of elements, the drive-point impedance of each element is primarily its impedance in free-space, as modified by the mutual impedance caused by the fields in the other elements in the array.

In general, an EH antenna is comprised of two elements that are in close proximity to one another (e.g., less than 1% of a wavelength). Under these conditions, the mutual impedance between the two elements is the dominant factor in each element's drive-point impedance, and slight changes to the lumped-constant network feeding power to one element has a great effect on the drive-point impedance of the other element. Adjusting the network feeding power to one element therefore changes the mutual impedance to the other element and may cause the network feeding the other element to become improperly adjusted.

The network adjustment procedures used in some prior art AM arrays may not be useful when attempting to tune an EH antenna to achieve proper RF drive because the source impedance for the RF becomes higher, and more non-linear with respect to frequency, as the power moves further from the RF amplifier output through the networks.

The solution described herein utilizes RF amplifiers as a theoretical ideal RF source. That is, RF amplifiers are generally considered to be close-to-theoretically-ideal sources of RF energy in that they provide the energy from an extremely low impedance source. In an embodiment, the solution splits the RF amplifier feeding the EH antenna into two separate outputs, with separate power and phase control of the two outputs. The system uses a common RF excitation system and a common Amplitude Modulation system but splits the RF signal and the modulation control signal each into two paths just before reaching the output power amplifier, which has two separate outputs. The RF signal feeding the two inputs to the output amplifier is passed through a controllable delay system so that the two outputs may be set to the proper quadrature phase angle. The power provided by the two outputs of the RF amplifier may also be separately adjustable. A simple lumped-constant network may be used between the amplifier outputs and the element inputs to reduce stress in the amplifiers and improve efficiency of power transfer from amplifiers to elements. The solution enables improved control and/or adjustment of the relative phase and power applied to each element in an EH antenna. The solution may enable improved efficiencies between the transmitted Field Strength based on the power consumed.

Various example embodiments of the present inventions are described herein. Those of ordinary skill in the art will realize that the following detailed description is illustrative only and is not intended to be in any way limiting. Other embodiments will readily suggest themselves to such skilled persons having the benefit of this disclosure.

In the interest of clarity, not all of the routine features of the implementations described herein are shown and described. In the development of any such actual implementation, numerous implementation-specific decisions must be made in order to achieve the developer's specific goals, such as compliance with application, safety, regulatory, and business constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Referring to FIG. 1A, a conceptual diagram of an example cross-field antenna 10 is shown. The antenna 10 includes a first radiator 20, a second radiator 30, and a metallic ground plane 40. The first radiator 20 may be a monopole antenna with a single feed point. In an example, the first radiator 20 may be a cylindrical structure and is oriented orthogonally to the second radiator 30. The second radiator 30 may be a monopole antenna with a single feed point. In an example, the second radiator 30 may be a disk structure which is parallel to the earth and between the earth and the first radiator 20. The axis of the first radiator 20 is typically located at the center of the second radiator 30. In general, the dimensions of the first radiator 20 and the second radiator 30 are much smaller than the wavelength of the operational frequency of the antenna 10. The metallic ground plane 40 is disposed on the ground plane under the second radiator 30 and is typically larger (e.g., diameter, horizontal surface area) than the second radiator 30. The cylindrical shape of the first radiator 20 and the disk shape of the second radiator 30 are examples only and not limitations as other radiator shapes may be used.

Referring to FIG. 1B, an example low-profile medium wave antenna is shown. In this embodiment, the antenna system includes a first radiator 20 in cylindrical structure referred to as an E-cylinder 100. In one embodiment, the E-cylinder may be a hollow metal cylinder. It may be formed of a sheet of metal or concentric sheets of metal, either solid or perforated by openings, or in one embodiment it may be formed of a lattice of metal wires, tubes, or bars. These wires, tubes or bars may, in one embodiment, be arranged in a cage-like structure with vertical bars. These bars may be joined at the top and/or bottom by rings. Each E-cylinder may be connected by a conductive feed 102 such as a coaxial cable.

In one embodiment, the E-cylinder extends into a funnel structure 101 connected to the cylindrical part of the E-cylinder at its top end. In one embodiment, this funnel structure may have a roughly cone shape or a tapering cone or funnel shape. This structure may radiate out from the cylindrical part of the E-cylinder and terminate in a rim 108 that is larger than the diameter of the E-cylinder.

The antenna includes a second radiator 30 referred to as a D-plate 104 which may be positioned below the base of the E-cylinder. The D-plate 104 may be insulated from the E-cylinder, as well as insulated from a ground plane 105 below it. The D-plate may be one sheet of metal or concentric sheets of metal, either solid or perforated by openings, or in one embodiment it may be formed of a lattice of metal wires, tubes, or bars. It may be connected, via a conductor, to conductive feed 103 such as a coaxial cable.

Below the D-plate 104 may be a ground plane 105 and a platform 106 to raise the antenna above ground level 107. The dimensions of the ground plane may vary based on an intended range of operation. For example, the ground plane 105 may be, in one embodiment, at least 25'×25' for a transmission frequency of 1.630 MHz. In another example, the ground plane may be at least 30'×30' for a transmission frequency of 940 kHz. The dimensions of the ground planes are examples only, and not limitations as other sizes of ground planes may also be used with these and other frequency ranges.

In an example, the D-plate 104 may be a horizontal conductor raised above and insulated from a ground plane, and the E-cylinder 100 may be a vertical hollow conductive cylinder of smaller diameter than the D-plate 104, which is mounted concentrically above and insulated from the D-plate 104. In one embodiment, the antenna can be placed on a building to increase its height and avoid ground-level effects and interference.

The height of the E-cylinder, the diameter of the D-plate and the area of the ground plane may be designed to have a specific relationship to the broadcast frequency. In the case of 1.630 MHz, one embodiment of the antenna may have an E-cylinder (including the funnel structure) of approximately 6.38 meters, while the diameter of the D-plate may be approximately 3.8 meters. In the embodiment shown in FIG. 1, the diameter of the E-cylinder is 1.75 meters, the diameter of the lip of the funnel structure is 7.5 meters, the height of the platform is 3.2 meters, and the gap between the ground plane and the base of the E-cylinder is 1.3 meters. This configuration may in one embodiment be scaled larger or smaller by a scale factor.

The antenna may be fed via feeds (102 and 103) from a feed circuit or set of feed circuits. Specific multiple networks may be designed that feed approximately half of the transmitter input power to the E-cylinder 100, and approximately half to the D-plate 104. These networks may provide impedance isolation at the input, while allowing adjustment of the antenna element phasing to be such that the electric and magnetic fields generated by the antenna elements produce surface wave propagation.

Figure 2:
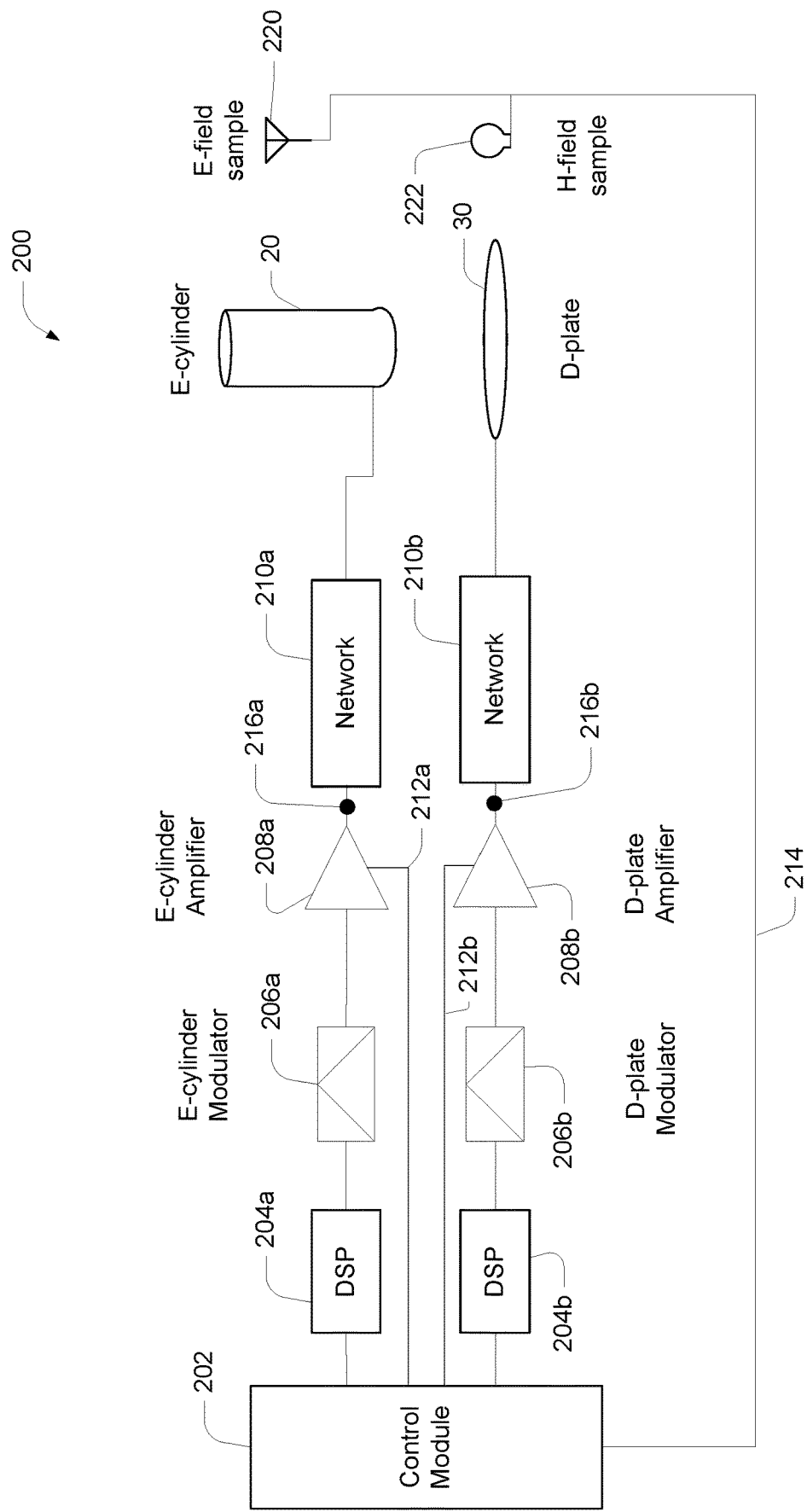
FIG. 2 is a schematic drawing of an example two amplifier antenna feed network.

Referring to FIG. 2, a schematic drawing of an example two amplifier antenna feed network 200 is shown. The network 200 provides a first radio frequency (RF) signal to a first radiator, such as the E-cylinder 20, and a second radio frequency (RF) signal to a second radiator, such as the D-plate 30. The network 200 includes a control module 202, a first Digital Signal Processor (DSP) module 204a, a second DSP module 204b, a first modulator 206a (e.g., the E-cylinder modulator), a second modulator 206b (e.g., the D-plate modulator), a first amplifier 208a (e.g., the E-cylinder modulator), a second amplifier 208b (e.g., the D-plate amplifier), a first tuning network 210a, and a second tuning network 210b. The control module 202 is a computer system configured to provide carrier and content information to the DSP modules 204a-b. One or more content sources (not shown in FIG. 2) such as analog input (e.g., an audio signal) and/or digital sources may provide an input to the control module 202 to be broadcast by the antenna system. The DSP modules 204a-b are configured to generate two equal digital signals in quadrature phase from one another. That is, the first DSP module 204a generates a first signal to be transmitted via the first radiator 20 (e.g., the E-cylinder), and the second DSP module 204b generates a second signal to be transmitted via the second radiator 30 (e.g., the D-plate). A delta phase value may be determined based on the phase difference between the first and second signals. In an example, the phase of the first signal may lead or lag the phase of the second signal by approximately 90 degrees (e.g., +/−10 degrees). In general, the delta phase value in the network will be 90 degrees (i.e., quadrature phase), but environmental factors such as local topology or other antenna installation variables may require an adjustment to the delta phase value to improve the transmitted signal quality. The DSPs 204a-b are configured to adjust the delta phase value based on signals received from the control module 202.

The DSP modules 204a-b provide the respective phase adjusted signals to the first modulator 206a and the second modulator 206b. In an example, the modulators 206a-b are configured to output a pulse width modulated radio frequency (PWM RF) signal to the respective amplifiers 208a-b. Other modulation circuits and configurations may be used to provide a modulated version of the phase adjusted first and second signals output from the DSPs 204a. The modulators 206a-b output the PWM RF signal to the respective amplifiers 208a-b. In an example, the modulators 206a-b may be operably coupled to a respective amplifier 208a-b via a fiber optic cable or other low loss transmission medium. The control module 202, DSPs 204a-b, and the modulators 206a-b may be located at a substantial distance (e.g., feet, yards, miles) from the amplifiers 208a-b and the radiators 20, 30. In general, the amplifiers 208a-b are configured to receive an RF signal, modulation information, and an output power control. The RF signal may be at a constant amplitude and a constant phase delta with respect to the other RF feeds to other RF amplifiers in the system. In an example, the RF signal may be provided to an amplifier 208a-b as a 50% duty cycle square wave, with no AM, FM or PM. Example of the modulation information provided to the amplifiers 208a-b may include analog audio or digital Quadrature Amplitude Modulation (QAM). The DSPs 204a-b may be configured to correct for group delay variation across a band to make the upper and lower audio sidebands equal in amplitude and in phase, symmetrical about the center of the carrier, in both the D-plate signal and the E-cylinder signal, such that the signal will sum in the EH field with lower distortion and higher frequency response. The DSPs 204a-b may also be configured to make each QAM carrier equal in amplitude and equal in phase, symmetrical about the center of the carrier, in both the D-plate signal and the E-cylinder signal to minimize potential errors transmitted due to group delay variation.

In an example, the first amplifier 208a is configured to receive the modulation signal from the first modulator 206a and a first power control signal 212a from the control module 202. The second amplifier 208b is configured to receive the modulation signal from the second modulator 206b and a second power control signal 212b from the control module 202. The amplifiers 208a-b each include a variable direct current power source and the respective power control signals 212a-b are configured to control the amplifier power values. In an example, the amplifiers 208a-b may be Field Effect Transistor (FET), including Metal Oxide Semiconductor Field Effect Transistor (MOSFET) amplifiers configured to output power in a range of approximately 0-1500 W. Other power supplies, amplifier sizes and output values may also be used. In one embodiment, the outputs of the first and second amplifiers 208a-b are approximately equal. Approximately equal may be within +/−10% (e.g., 40%-60%) of one another.

The network 200 may include current and voltage samplers such as a first feedline sampling toroid 216a and a second feedline sampling toroid 216b configured to detect the output signal of the respective feedlines and may be used for tuning and monitoring of the network output. The sampling toroids 216a-b are operably coupled to the control module 202 and provide a means for detecting the delta phase value between the first signal and the second signal. In general, the control module 202, via the DSPs 204a-b, provides that the first and second signal are approximately within quadrature phase (e.g., +/−10%) at the sampling toroids 216a-b. In one embodiment, the first network may be phased −45 degrees, and the second network may be phased +45 degrees. The phases of the signals output from the amplifiers 208a-b are adjustable.

The phase adjusted signals are fed to a respective first network 210a and a second network 210b. The networks 210a-b may be minimum parts networks configured to match the impedances of the amplifier outputs with the respective first and second radiators 20, 30. In an example, the networks 210a-b may each contain a single coil, a single capacitor, or other impedance matching circuits such as an L-network, a T-network, a Pi-network, etc. In general, the networks 210a-b are installation specific and provide impedance matching to reduce the stress on the amplifiers 208a-b. The specifications of the components in the networks 210a-b may vary based on the operating frequency and other site specific factors such as local geological features and the proximity to other conductors (e.g., buildings). The networks 210a-b may include some variable components to allow for seasonal changes (e.g., ice accretion on radiator components) or other changes around the installation site (e.g., modifications to buildings). The sampling toroids 216a-b, and field strength measurements from sensors in the far field of the radiators 20, 30 may be used to provide feedback for the design and adjustment of the networks 210a-b.

In an example, one or more sensors may be located in the far field of the radiators 20, 30 and configured to provide feedback to the control module 202. An E-field sensor 220 may be operably coupled to the control module 202 via a control link 214 and configured to provide measurement data associated with the electric field emitted by the radiators 20, 30. An H-field sensor 222 may be operably coupled to the control module 202 via the control link 214 and configured to provide measurement data associated with the magnetic field emitted by the radiators 20, 30. The E-field sensor 220 and the H-field sensor 222 may be combined into a single sensor. The control link 214 may be a wired or wireless communication path (e.g., ethernet, WiFi, cellular network). Multiple E-field and H-field sensors 220, 222 may be disposed in the far field of the radiators 20, 30 and configured to provide field measurement data to the control module 202.

Figure 3:
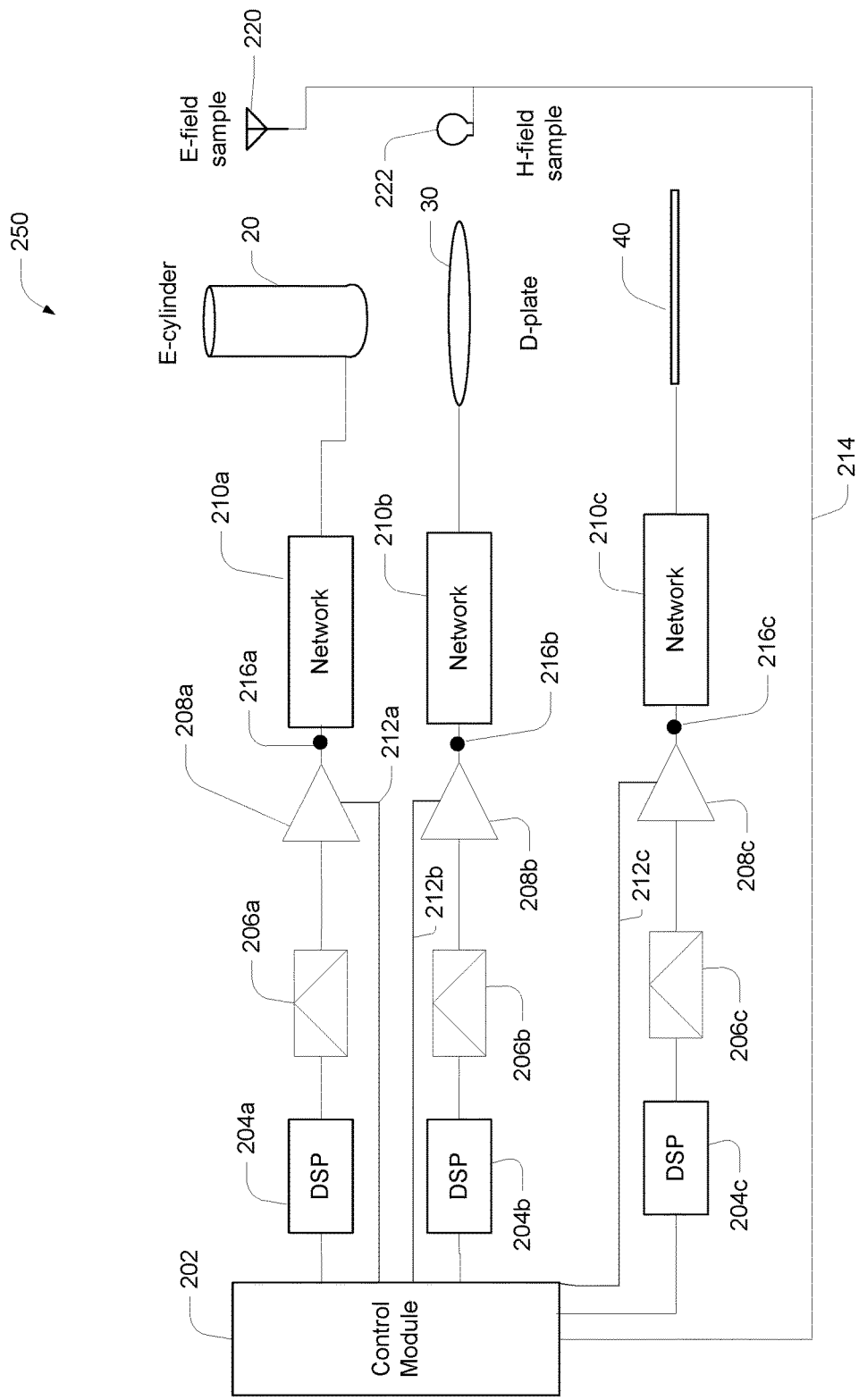
FIG. 3 is a schematic drawing of an example three amplifier antenna feed network.

Referring to FIG. 3, a schematic drawing of an example, three amplifier antenna feed network 250 is shown. The network 250 is similar to the two amplifier antenna feed network 200 with the addition of a third signal path operably coupled to a ground plane 40. The network 250 includes a third DSP 204c, a third modulator 206c (e.g., a ground plane modulator), a third amplifier 208c, a third sampling toroid 216c, and a third network 210c. The control module 202 is configured to provide a control signal to the third amplifier 208c via a third power control signal 212c. The components of the network 250 operate as described in FIG. 2. The amplifier power and phase setting for the ground plane 40 may vary based on the propagation conditions or other site specific factors (e.g., quality of the earth ground under the first and second radiators 20, 30). In an example, a direct current (e.g., not modulated) signal is provided to the ground plane 40. In other examples, the signal provided to the ground plane 40 may be a synchronous, modulated RF signal at the carrier frequency with an adjustable phase angle and adjustable power. Other modulation, power and phase configurations of the ground plane radiator 40 may be used to improve the far field strength of the signals emitted by the first and second radiators 20, 30.

Figure 4:
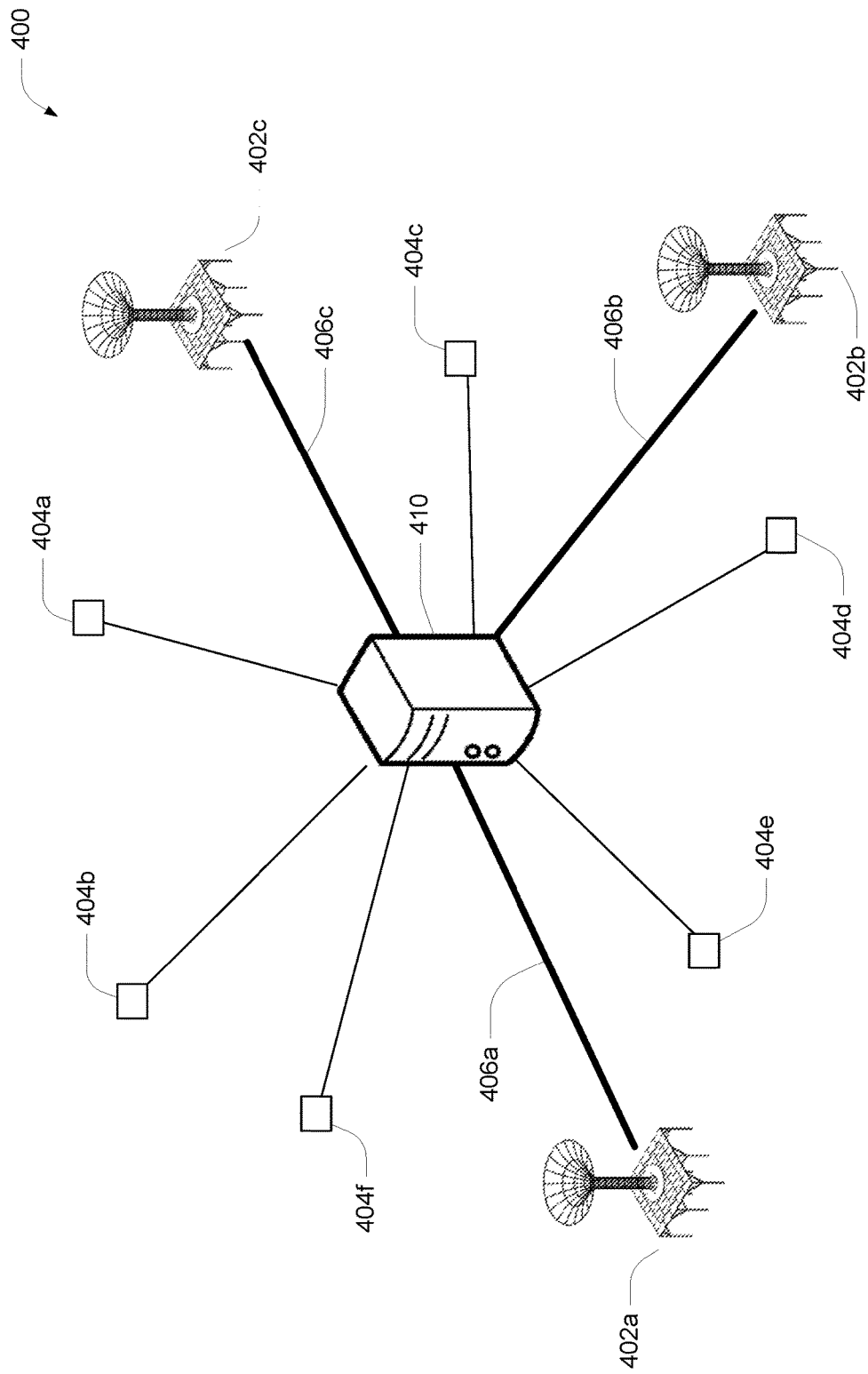
FIG. 4 is an example remote tuning network for one or more low-profile medium wave antennas.

Referring to FIG. 4, with further an example remote tuning network 400 for one or more low-profile medium wave antennas is shown. The network 400 includes two or more low-profile medium wave antennas 402a-c. In an example, the low-profile medium wave antennas 402a-c may be the antenna depicted in FIG. 1B, including a funnel shaped E-cylinder and a D-plate. Each of the antennas 402a-c is operably coupled to a remote computer 410 via a respective control link 406a-c. The remote computer 410 may include a plurality of processor, memory and peripheral devices based on the size of the network 400. The control links 406a-c may be fiber optic cables, or other low-loss communication channel, configured to convey a PWM modulation signal and an RF signal to each of the antennas 402a-c. The control links 406a-c may also send and receive control signals such as the control power signals 212a-c and corresponding sampling toroid 216a-c data. In an example, one or more signal sources (e.g., analog and digital) may be provided to the remote computer 410. The remote computer 410 may include a respective control module 202, DSPs 204a-b, and modulators 206a-b for each of the antennas 402a-c. The amplifiers 208a-b (and corresponding power supplies) and networks 210a-b may be collocated with the respective antennas 402a-c to reduce the transmission losses to the first and second radiators 20, 30. In an embodiment, the array of low-profile medium wave antennas 402a-c and corresponding control module(s) (e.g., the remote computer may be configured as a control module for each of the antennas 402a-c) may be used to realize a single-frequency directional AM antenna system radiating different amounts of energy along different compass azimuths, to increase signal strength in some directions to serve a greater area or population in those directions, while decreasing signal strength in other directions to reduce interference to other distant co-channel or adjacent-channel stations.

Referring again to FIG. 4, in an embodiment, the remote computer 410 may be configured to provide a different signal to be transmitted to each of the antennas 402a-c. For example, a first antenna 402a may broadcast a signal based on a first broadcast license (e.g., a first radio station at a first frequency), a second antenna 402b may broadcast a signal based on a second broadcast license (e.g., a second radio station at a second frequency), and a third antenna 402c may broadcast a signal based on a third broadcast license (e.g., a third radio station at a third frequency). A single technical management organization may be able to operate, manage, and maintain the remote computer 410, as well as the respective control modules 202, DSPs 204a-b, and modulators 206a-b for each of the antennas 402a-c from a single geographic location. The network 400 may include a plurality of far field sensors 404a-f operably coupled (e.g., wired or wireless) to the remote computer 410. In an example, the far field sensors 404a-f may be configured to communicate with the remote computer 410 via a wide area network (e.g., cellular phone network, the Internet via a WiFi access point, etc.). The far field sensors 404*a*-*f* may include E-field sensors 220 and H-field sensors 222 configured to provide field measurements to the remote computer 410. In operation, each of the antennas 402*a*-*c* may be configured to broadcast at a different medium wave operational frequency (e.g., 940 kHz, 1250 kHz, 1630 kHz etc.), and the far field sensors 404*a*-*f* may be configured to provide measurements for one or more of the operational frequencies. The remote computer 410 is configured to control the delta phase values and amplifier power values for each of the antennas 402*a*-*c*. In an example, the remote computer 410 may receive measurements from the far field sensors 404*a*-*f* and update the delta phase value, a first amplifier value (e.g., for the E-cylinder), and a second amplifier value (e.g., for the D-plate) of a particular antenna 402*a*-*c*. The adjustments may be based on pre-established algorithms or data structures. In an example, one or more look-up tables may correlate the far field measurements from one or more far field sensors 404*a*-*f* with a delta phase value, a first amplifier value and a second amplifier value.

The far field sensors 404*a*-*f* may be placed throughout the broadcast coverage area and the delta phase value, first amplifier value and second amplifier value may be adjusted based on the detected transmission beam shape (e.g., the measurements from multiple far field sensors). The far field sensors 404*a*-*f* may provide measurement data continuously or on a periodic basis (e.g., seconds, minutes, hours). In an example, the far field sensors 404*a*-*f* may be configured to measure environmental data such as temperature, humidity, luminosity, precipitation levels and barometric pressure and provide the environmental data to the remote computer 410. One or more look-up tables stored on, or otherwise accessible by, the remote computer 410 may be used to determine the delta phase value, the first amplifier value, and/or the second amplifier value based at least in part on the environmental data. For example, the presence of rain or ice may cause a degradation in the received power and the first and/or second amplifier values may be increased to compensate. In another example, in arid climates, a drought condition may impact the propagation of a ground wave and the delta phase value may be adjusted to compensate for the change in environmental conditions. Other correlations between environmental conditions and the delta phase value, the first amplifier value, and/or the second amplifier value may be stored on, or available to, the remote computer 410.

Figure 5:
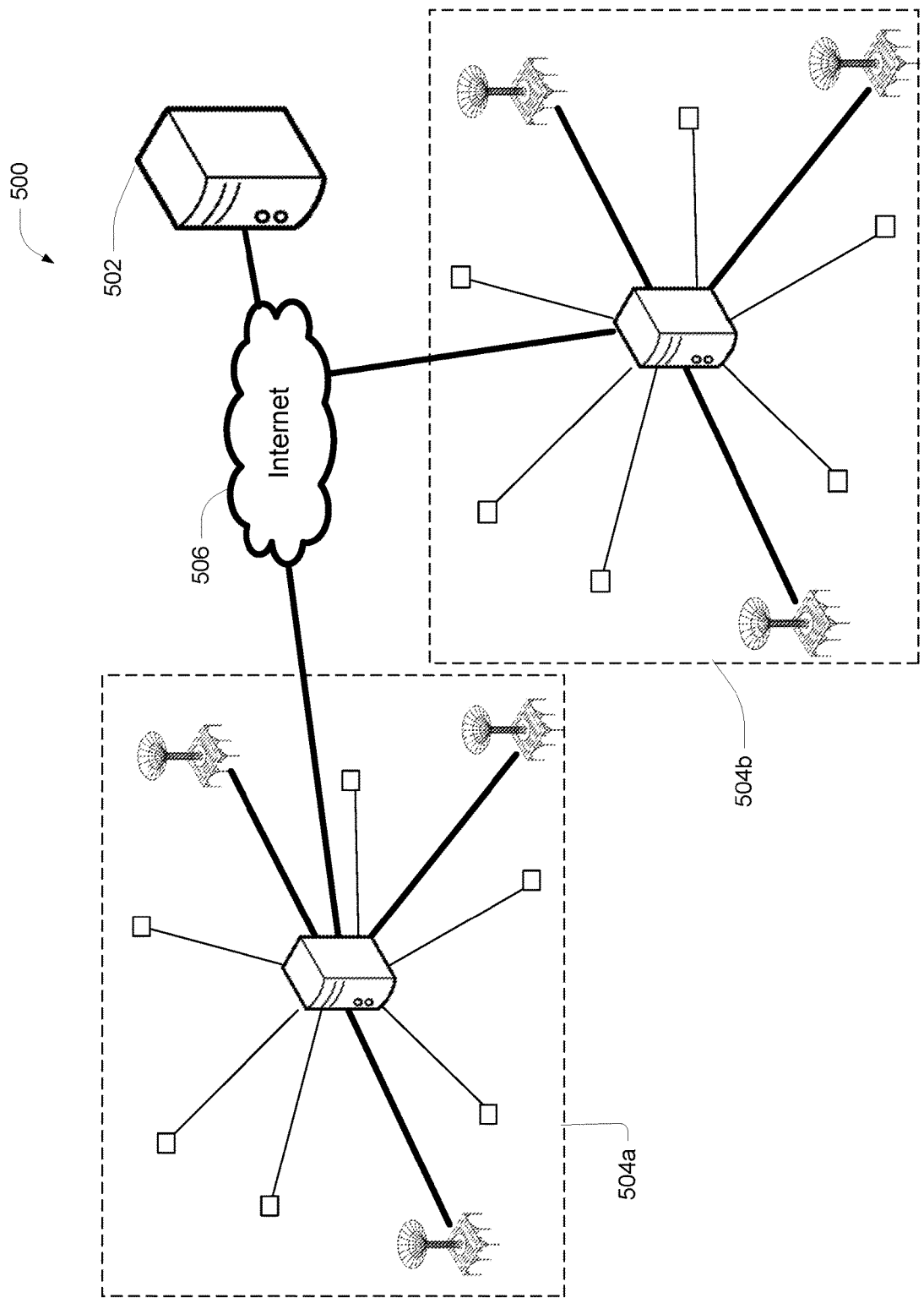
FIG. 5 is an example of a wide area tuning server for low-profile medium wave antennas.

Referring to FIG. 5, with further reference to FIG. 4, an example of a wide area tuning server 502 for low-profile medium wave antennas is shown. The server 502 may be a physical or virtual component of a larger tuning system 500. The system 500 may include a plurality of remote tuning networks 504*a*-*b* such as the network 400 described in FIG. 4. One or more remote computers in each of the remote tuning networks 504*a*-*b* may be configured to send and receive information to and from the wide area tuning server 502 via a wide area network such as the Internet 506. In an example, the wide area tuning server 502 may be a cloud-based solution such as SQL server running in the Microsoft Azure® cloud. The remote tuning networks 504*a*-*b* are configured to provide far field measurements and environmental data along with the corresponding delta phase, first amplifier and second amplifier values to the wide area tuning server 502. In an example, one or more of the far field sensors 404*a*-*f* and remote computers 410 in the remote tuning networks 504*a*-*b* may be configured to provide far field sensor measurement and/or tuning parameter data directly to the server 502 (e.g., Microsoft Azure Cloud Services, Amazon Web Services). The server 502 may be configured to support one or more machine learning or deep learning methods. For example, server 502 may utilize Azure Machine Learning services and may include one or more unsupervised learning algorithms to support clustering, dimensionality reduction, anomaly detection and association rule-mining based on the received frequency, far field measurements, environmental data, delta phase, first amplifier and second amplifier values received from the plurality of networks 504*a*-*b*. While FIG. 5 only depicts two remote tuning networks 504*a*-*b*, the server 502 may receive such data from several remote tuning networks disposed across the globe. Additional parameters such as site-specific geographical characterizations, solar cycle data, RF propagation metrics (e.g., solar flux index, A & K factors, etc.), as well as regional regulations may be stored in the server 502. The machine learning algorithms may also utilize these additional parameters to generate global and/or site-specific improved tuning parameters for one or more low-profile medium wave antennas (e.g., updated delta phase and amplifier settings). In an example, the improved tuning parameters may be made available (e.g., pushed, pulled) to one or more networks 504*a*-*b* via a web socket connection or other data transfer protocol. The updated tuning may be packaged in a suitable delivery format (e.g., XML, JSON, CVS) and stored in one or more look-up tables on the remote computer 410 with a network 504*a*-*b*. In an example, a network 504*a*-*b* may be configured to query with server 502 with one or more tuning parameters (including far field and environmental measurements) and receive updated delta phase and amplifier settings from the server 502. The wide area tuning server 502 may enable improvements in, and the dissemination of, low-profile medium wave transmitter parameters to increase the quality of analog and digital signals received in a broadcast area. The improve quality may include increased signal strength, increased bandwidth, decreased bit error rate, improved audio fidelity, and other ancillary receiver side benefits associated with an improved signal-to-noise (SNR) ratio.

Figure 6:
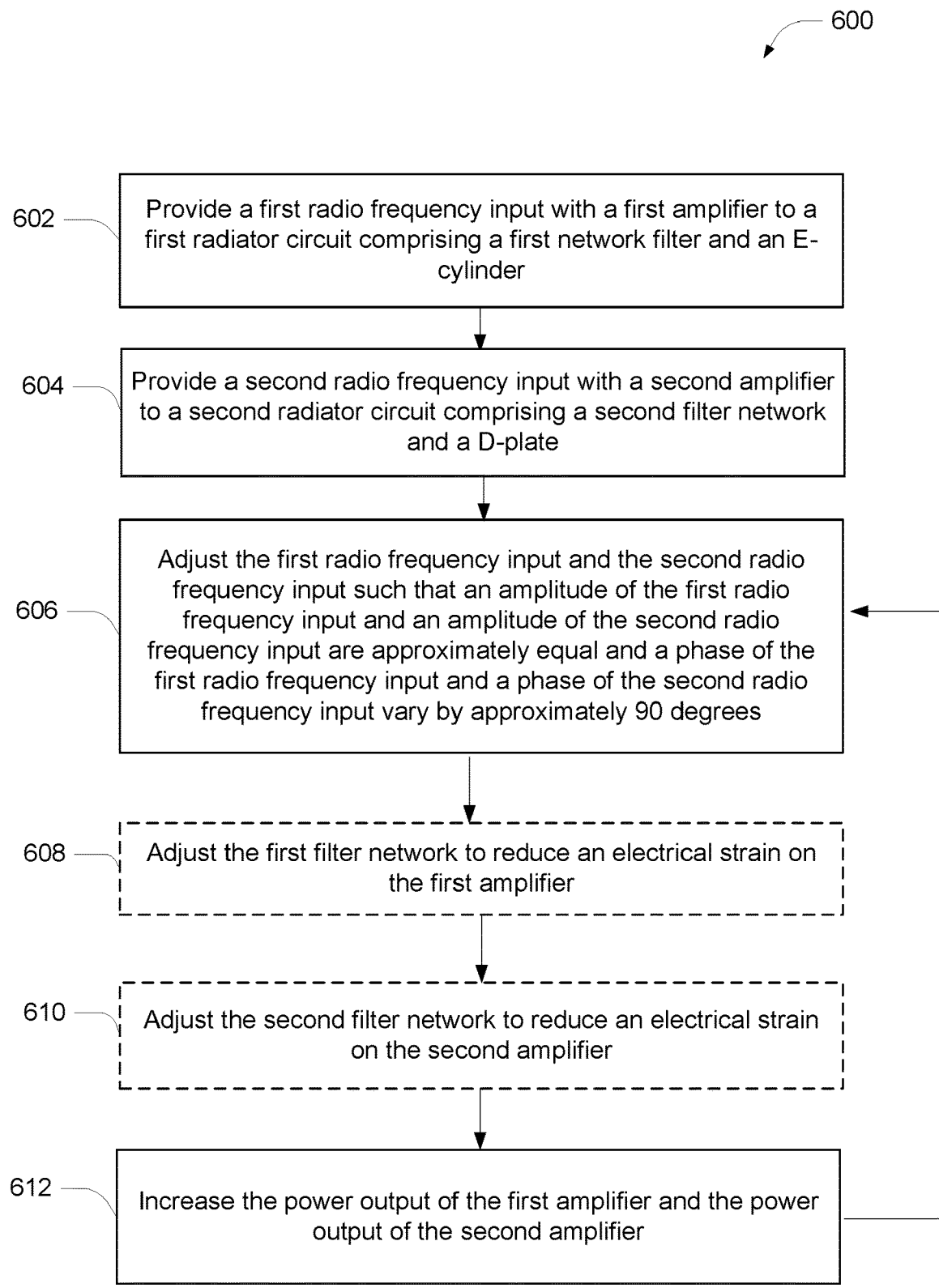
FIG. 6 is an example process flow diagram for tuning a two amplifier antenna feed network.

Referring to FIG. 6, with further reference to FIG. 2, a method 600 of tuning a two amplifier antenna feed network includes the stages shown. The method 600 is, however, an example only and not limiting. The method 600 may be altered, e.g., by having stages added, removed, rearranged, combined, performed concurrently, and/or having single stages split into multiple stages. In an example, the filter adjustments at stages 608 and 610 are optional.

At stage 602, the method includes providing a first radio frequency input with a first amplifier to a first radiator circuit comprising a first network filter and an E-cylinder. The first amplifier may be a means for providing the first radio frequency input. The first amplifier 208*a* receives a modulated signal from the first modulator 206*a* and a first power control signal 212*a* from the control module 202. The first amplifier 208*a* outputs an amplified radio frequency signal to the first radiator circuit including the first network 210*a* and the first radiator 20 which may be an E-cylinder such as depicted in FIGS. 1A and 1B. The first network 210*a* may be a minimum parts network configured to match the impedance of the first radiator 20 with the output of the first amplifier 208*a*. The first network 210*a* effectively reduces the strain on the components (e.g. FETs) within the first amplifier 208*a*.

At stage 604, the method includes providing a second radio frequency input with a second amplifier to a second radiator circuit comprising a second network filter and a D-plate. The second amplifier may be a means for providing the second radio frequency input. The second amplifier 208*b* receives a modulated signal from the second modulator 206*b* and a second power control signal 212*b* from the control module 202. The second amplifier 208*b* outputs an amplified radio frequency signal to the second radiator circuit including the second network 210*b* and the second radiator 30 which may be a D-plate such as depicted in FIGS. 1A and 1B. The second network 210*b* may be a minimum parts network configured to match the impedance of the second radiator 30 with the output of the second amplifier 208*b*. The second network 210*b* effectively reduces the strain on the components (e.g., FETs) within the second amplifier 208*b*.

At stage 606, the method includes adjusting the first radio frequency input and the second radio frequency input such that an amplitude of the first radio frequency input and an amplitude of the second radio frequency input are approximately equal and a phase of the first radio frequency input and a phase of the second radio frequency input vary by approximately 90 degrees. The control module 202 may be a means for adjusting the amplitude of the first and second radio frequency inputs. The first modulator 206*a* may output an unmodulated carrier signal to the first amplifier 208*a*, and the control module 202 may provide a power control signal configured to the first amplifier 208*a* to output a relatively low power signal (e.g., 5-20 W). The amplitude and phase of the amplifier output is detected by the first sampling toroid 216*a*. The second modulator 206*b* may output an unmodulated carrier signal to the second amplifier 208*b*, and the control module 202 may provide a power control signal configured to the second amplifier 208*b* to output a relatively low power signal (e.g., 5-20 W). The amplitude and phase of the amplifier output is detected by the second sampling toroid 216*b*. The control module 202 may increase or decrease the power on the amplifiers 208*a-b* to ensure the amplitude of the signals are approximately equal (e.g., +/−10%). The DSPs 204*a-b* may be a means for adjusting the phases of the first and second radio frequency inputs. The DSPs 204*a-b* may be configured to vary the phase of the signals as detected at the first and second sampling toroids 216*a-b* such that the delta phase between the two radio frequency inputs vary by approximately 90 degrees (e.g., +/−10%). In an example, the phase of the first radio frequency input may be approximately +45 degrees and the phase of the second radio frequency input may be −45 degrees. Other approximately quadrature angles between the two signals may also be used.

At stage 608, the method optionally includes adjusting the first filter network to reduce the electrical strain on the first amplifier. The first network 210*a* may be a minimum parts network configured to match the impedance of the output of the first amplifier 208*a* with the impedance of the E-cylinder. In an example, the first network 210*a* may contain a single coil, a single capacitor, or other impedance matching circuits such as a L-network, T-network, Pi-network, etc. The first network 210*a* may be installation specific and provides impedance matching to reduce the stress on the first amplifier 208*a*. The stress may be caused by high reflected power (e.g., a standing wave ratio (SWR) greater than 1.5) and the first network 210*a* is designed to reduce the amount of power reflected to the amplifier. The specifications of the components in the first network 210*a* may vary based on the design of the E-cylinder, operating frequency and other site specific factors such as local geological features and the proximity to other conductors (e.g., buildings). The reactance values (e.g., inductance, capacitance) of the components within the first network 210*a* may require adjustment when an antenna system is operating at different power levels. Typically, a commercial broadcast antenna will operate at one or two (e.g., day and evening) power levels and the reactance values of the components within the first network 210*a* will not need further adjustment. In an example, the first network 210*a* may include some variable reactance components to allow for seasonal changes (e.g., ice accretion on radiator components) or other subsequent changes around the installation site (e.g., modifications to buildings) which may impact the impedance of the antennas system. One or more servos may be installed on the variable reactance components and the control module 202 may be configured to adjust the reactance value of the first network to reduce the strain on the first amplifier 208*a* (e.g., reduce the reflected power).

At stage 610, the method optionally includes adjusting the second filter network to reduce the electrical strain on the second amplifier. The second network 210*b* may be a minimum parts network configured to match the impedance of the output of the second amplifier 208*b* with the impedance of the D-plate. In an example, the second network 210*b* may contain a single coil, a single capacitor, or other impedance matching circuits such as a L-network, T-network, Pi-network, etc. The second network 210*b* may be installation specific and provides impedance matching to reduce the stress on the second amplifier 208*b*. The stress may be caused by high reflected power (e.g., a standing wave ratio (SWR) greater than 1.5) and the second network 210*b* is designed to reduce the amount of power reflected to the amplifier. The specifications of the components in the second network 210*b* may vary based on the design of the D-plate, proximity to the ground plane, operating frequency and other site specific factors such as local geological features and the proximity to other conductors (e.g., buildings). The reactance values (e.g., inductance, capacitance) of the components within the second network 210*b* may require adjustment when an antenna system is operating at different power levels. Typically, a commercial broadcast antenna will operate at one or two (e.g., day and evening) power levels and the reactance values of the components within the second network 210*b* will not need further adjustment. In an example, the second network 210*b* may include some variable reactance components to allow for seasonal changes (e.g., ice accretion on radiator components) or other subsequent changes around the installation site (e.g., modifications to buildings) which may impact the impedance of the antennas system. One or more servos may be installed on the variable reactance components and the control module 202 may be configured to adjust the reactance value of the second network 210*b* to reduce the strain on the second amplifier 208*b* (e.g., reduce the reflected power).

At stage 612, the method includes increasing the power output of the first amplifier and the power output of the second amplifier. The control module 202 may be a means of increasing the output power. The control module 202 is configured to send a first power control signal 212*a* to the first amplifier 208*a* and a second power control signal 212*b* to the second amplifier 208*b*. The power output of first and second amplifiers is typically in the range of 1000-1500 W, but other power output values may be used. The power increase rate to each of the first and second amplifier should be approximately equal (e.g., within 20% of one another) and the quadrature phase difference should be maintained. The control module 202 receives the amplitude and phase measurements from the first and second sampling toroids 216*a-b* and is configured to control the amplitude and phase as the amplifier power is increased.

Figure 7:
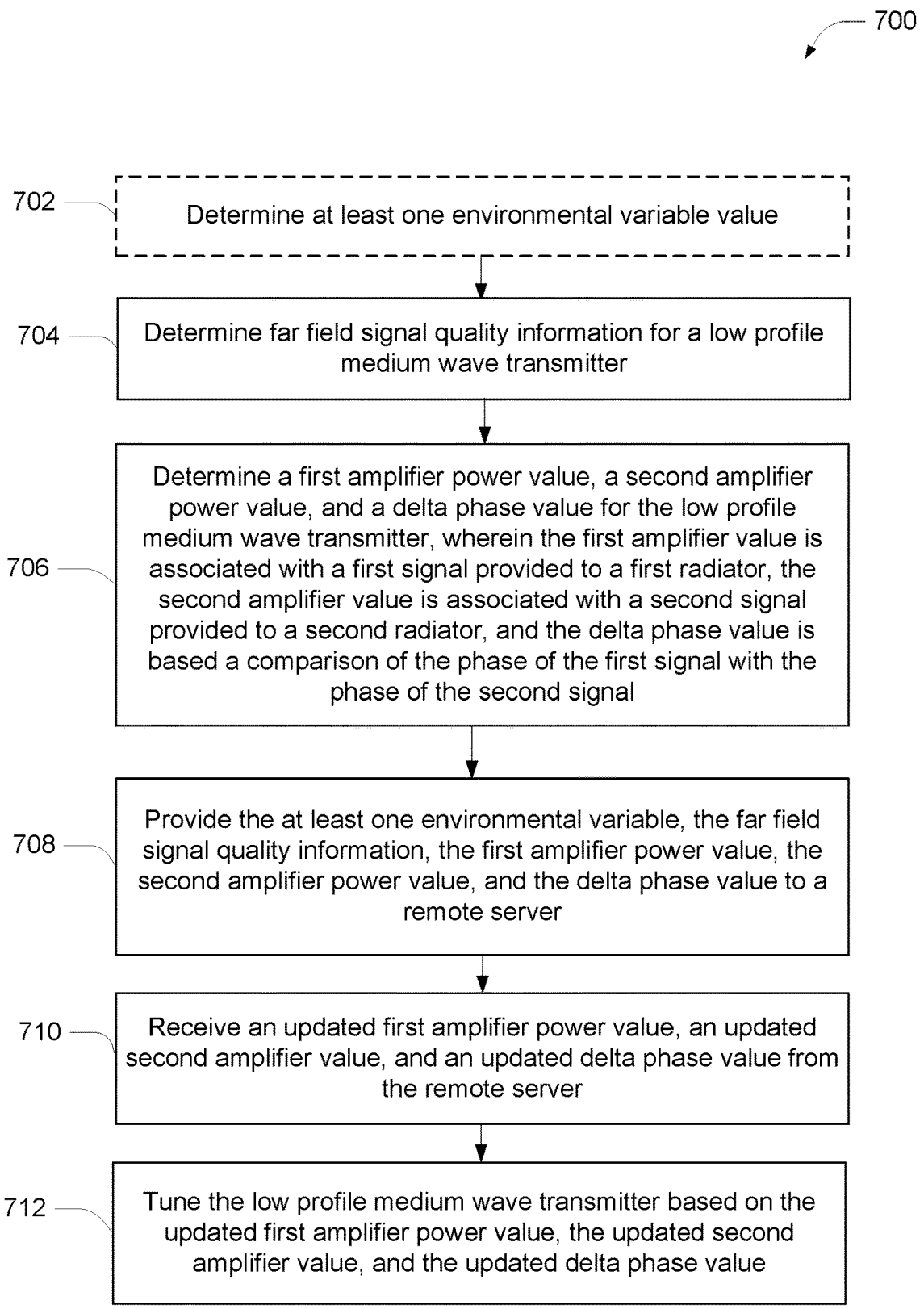
FIG. 7 is an example process flow diagram for tuning a low-profile medium wave antenna.

Referring to FIG. 7, with further reference to FIGS. 1A-6, a method 700 of tuning a low-profile medium wave antenna includes the stages shown. The method 700 is, however, an example only and not limiting. The method 700 may be altered, e.g., by having stages added, removed, rearranged, combined, performed concurrently, and/or having single stages split into multiple stages. For example, determining at least one environmental variable at stage 702 is optional and thus may not be provided at stage 708.

At stage 702, the method may optionally include determining at least one environmental variable value. The far field sensors 404a-f may be a means for determining an environmental variable. The far field sensors 404a-f may include one or more sensors configured to measure one or more environmental variables such as temperature, humidity, luminosity, precipitation levels and barometric pressure and provide the environmental data to the remote computer 410. The remote computer 410 may be configured to store the environmental measurements along with a sensor ID value (i.e., to identify the sensor taking the measurement) and date/time information. The location of the sensor ID may also be stored in the remote computer 410 or on another networked resource. In an example, the far field sensors 404a-f may be configured to provide the environmental variable values to a cloud-based server 502.

At stage 704, the method includes determining far field signal quality information for a low-profile medium wave transmitter. The far field sensors 404a-f may be a means for determining a signal quality. In an example, a far field sensor 404a-f may include an E-field detector 220 and an H-field detector 222 and may be configured to utilize the respective E-field and H-field signal strengths associated with a transmitting low-profile medium wave transmitter as signal quality information. In an example, the signal quality information may be a bit error rate associated with a digital transmission from the low-profile medium wave transmitter. The remote computer 410 may be configured to store the far field signal quality information along with a sensor ID value (i.e., to identify the sensor taking the measurement) and date/time information. The location of the sensor ID may also be stored in the remote computer 410 or on another networked resource. In an example, the far field sensors 404a-f may be configured to provide the far field signal quality information to a cloud-based server 502.

At stage 706, the method includes determining a first amplifier power value, a second amplifier power value, and a delta phase value for the low-profile medium wave transmitter, wherein the first amplifier value is associated with a first signal provided to a first radiator, the second amplifier value is associated with a second signal provided to a second radiator, and the delta phase value is based upon a comparison of the phase of the first signal with the phase of the second signal. The control module 202 may be means for determining the first amplifier power value, the second amplifier power value, and the delta phase value. The control module 202 may store the current first amplifier power value, the current second amplifier power value, and the current delta phase value in a local memory for one or more antennas 402a-c.

At stage 708, the method includes providing the at least one environmental variable, the far field signal quality information, the first amplifier power value, the second amplifier power value, and the delta phase value to a remote server. The control module 202 is configured to provide (e.g., push(send) or pull (allow access)) the current first amplifier power value, the current second amplifier power value, and the current delta phase value to the server 502. In an example, the control module 202 may also provide the far field quality information and the at least one environmental variable value received from the far field sensors 404a-f to the server 502. The control module 202 may utilize one or more internet transport protocols (e.g., TCP/IP) to provide the at least one environmental variable, the far field signal quality information, the first amplifier power value, the second amplifier power value, and the delta phase value to the server 502.

At stage 710, the method includes receiving an updated first amplifier power value, an updated second amplifier value, and an updated delta phase value from the remote server. The control module 202 may be a means for receiving the amplifier and phase values. The server 502 may be configured to determine updated tuning parameters by analyzing the at least one environmental variable, the far field signal quality information, the first amplifier power value, the second amplifier power value, and the delta phase value received at stage 708 and determine updated tuning. The analysis may include comparing the current tuning and far field sensor data with machine learning results obtained from previously obtained tuning and sensor data from one or more tuning networks 504a-b. For example, the machine learning results may include predictive models based on tuning parameter variables and expected far field quality information. The server 502 may be configured to provide the updated tuning parameters to the control module 202.

At stage 712, the method includes tuning the low-profile medium wave transmitter based on the updated first amplifier power value, the updated second amplifier value, and the updated delta phase value. The control module 202 may be means for tuning the low-profile medium wave transmitter. The control module 202 may utilize the DSPs 204a-b to change the delta phase value to the updated delta phase value and the power control signals 212a-b to change the first and second power amplifier values to the updated first amplifier power value and the updated second amplifier value.

Figure 8:
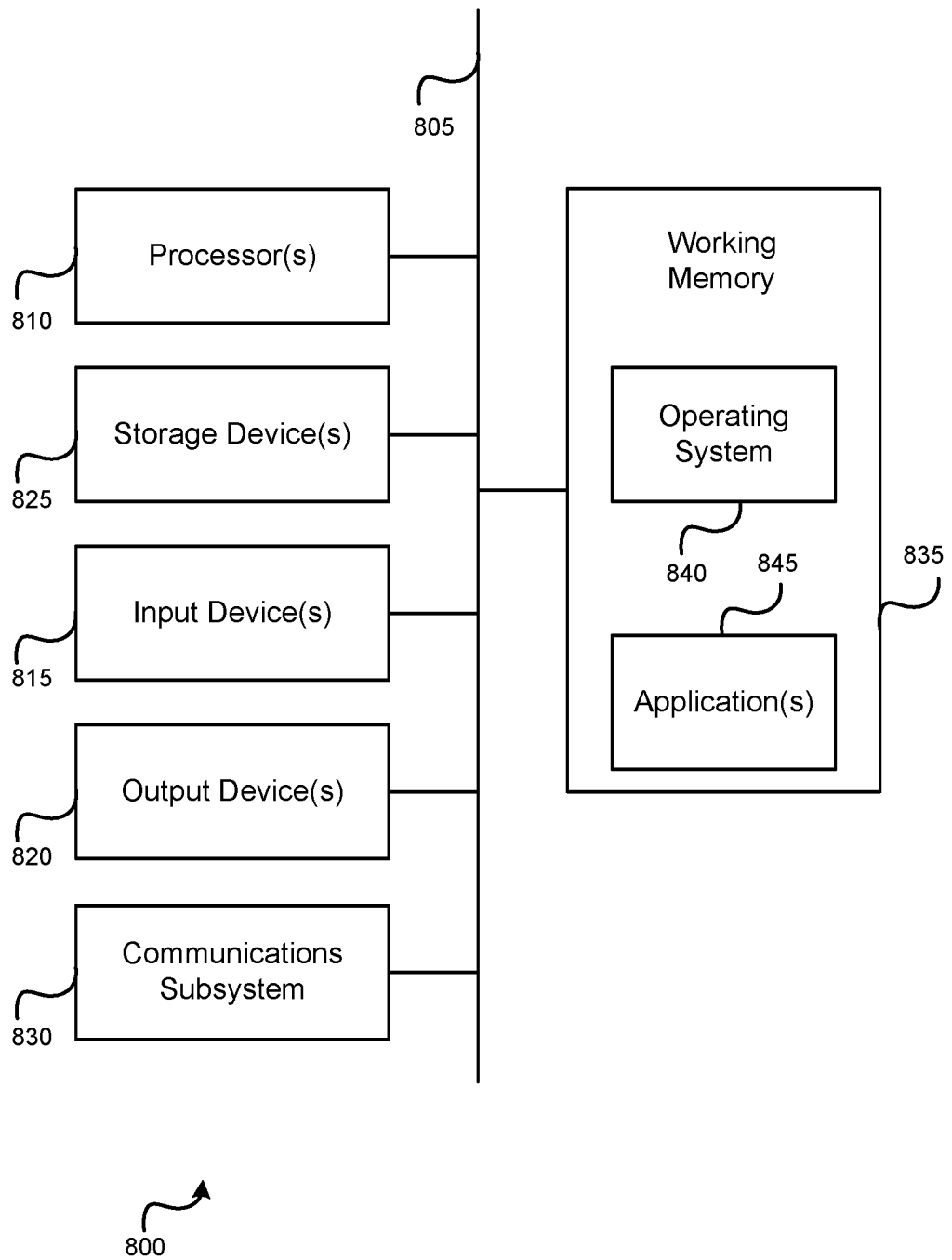
FIG. 8 illustrates a block diagram of an example of a computer system.

Referring to FIG. 8, with further reference to FIGS. 2-5, an example of a computer system 800 is shown. FIG. 8 provides a schematic illustration of one embodiment of a computer system 800 that can perform the methods provided by various other embodiments, as described herein, and/or can function as the control module 202, remote computer 410, and the server 502. It should be noted that FIG. 8 is meant only to provide a generalized illustration of various components, any or all of which may be utilized as appropriate. FIG. 8, therefore, broadly illustrates how individual system elements may be implemented in a relatively separated or relatively more integrated manner.

The computer system 800 is shown comprising hardware elements that can be electrically coupled via a bus 805 (or may otherwise be in communication, as appropriate). The hardware elements may include one or more processors 810, including without limitation one or more general-purpose processors and/or one or more special-purpose processors (such as digital signal processing chips, graphics acceleration processors, and/or the like); one or more input devices 815, which can include without limitation a mouse, a keyboard and/or the like; and one or more output devices 820, which can include without limitation a display device, a printer and/or the like.

The computer system 800 may further include (and/or be in communication with) one or more non-transitory storage devices 825, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The computer system 800 might also include a communications subsystem 830, which can include without limitation a modem, a network card (wireless or wired), an infrared communication device, a wireless communication device and/or chipset (such as a Bluetooth™ device, an 802.11 device, a WiFi device, a WiMax device, cellular communication facilities, etc.), and/or the like. The communications subsystem 830 may permit data to be exchanged with a network (such as the network described below, to name one example), other computer systems, and/or any other devices described herein. In many embodiments, the computer system 800 will further comprise a working memory 835, which can include a RAM or ROM device, as described above.

The computer system 800 also can comprise software elements, shown as being currently located within the working memory 835, including an operating system 840, device drivers, executable libraries, and/or other code, such as one or more application programs 845, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

A set of these instructions and/or code might be stored on a computer-readable storage medium, such as the storage device(s) 825 described above. In some cases, the storage medium might be incorporated within a computer system, such as the system 800. In other embodiments, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the computer system 800 and/or might take the form of source and/or installable code, which, upon compilation and/or installation on the computer system 800 (e.g., using any of a variety of generally available compilers, installation programs, compression/decompression utilities, etc.) then takes the form of executable code.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

As mentioned above, in one aspect, some embodiments may employ a computer system (such as the computer system 800) to perform methods in accordance with various embodiments of the invention. According to a set of embodiments, some or all of the procedures of such methods are performed by the computer system 800 in response to processor 810 executing one or more sequences of one or more instructions (which might be incorporated into the operating system 840 and/or other code, such as an application program 845) contained in the working memory 835. Such instructions may be read into the working memory 835 from another computer-readable medium, such as one or more of the storage device(s) 825. Merely by way of example, execution of the sequences of instructions contained in the working memory 835 might cause the processor(s) 810 to perform one or more procedures of the methods described herein.

The terms "machine-readable medium" and "computer-readable medium," as used herein, refer to any medium that participates in providing data that causes a machine to operate in a specific fashion. In an embodiment implemented using the computer system 800, various computer-readable media might be involved in providing instructions/code to processor(s) 810 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 825. Volatile media include, without limitation, dynamic memory, such as the working memory 835. Transmission media include, without limitation, coaxial cables, copper wire and fiber optics, including the wires that comprise the bus 805, as well as the various components of the communication subsystem 830 (and/or the media by which the communications subsystem 830 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 810 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 800. These signals, which might be in the form of electromagnetic signals, acoustic signals, optical signals and/or the like, are all examples of carrier waves on which instructions can be encoded, in accordance with various embodiments of the invention.

The communications subsystem 830 (and/or components thereof) generally will receive the signals, and the bus 805 then might carry the signals (and/or the data, instructions, etc. carried by the signals) to the working memory 835, from which the processor(s) 805 retrieves and executes the instructions. The instructions received by the working memory 835 may optionally be stored on a storage device 825 either before or after execution by the processor(s) 810.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

Other examples and implementations are within the scope and spirit of the disclosure and appended claims. For example, due to the nature of software and computers, functions described above can be implemented using software executed by a processor, hardware, firmware, hardwiring, or a combination of any of these. Features implementing functions may also be physically located at various positions, including being distributed such that portions of functions are implemented at different physical locations.

Also, as used herein, "or" as used in a list of items prefaced by "at least one of" or prefaced by "one or more of" indicates a disjunctive list such that, for example, a list of "at least one of A, B, or C," or a list of "one or more of A, B, or C," or "A, B, or C, or a combination thereof" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

A wireless communication system is one in which at least some communications are conveyed wirelessly, e.g., by electromagnetic and/or acoustic waves propagating through atmospheric space rather than through a wire or other physical connection. A wireless communication network may not have all communications transmitted wirelessly, but is configured to have at least some communications transmitted wirelessly. Further, the term "wireless communication device," or similar term, does not require that the functionality of the device is exclusively, or evenly primarily, for communication, or that the device be a mobile device, but indicates that the device includes wireless communication capability (one-way or two-way), e.g., includes at least one radio (each radio being part of a transmitter, receiver, or transceiver) for wireless communication.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

Various forms of computer-readable media may be involved in carrying one or more sequences of one or more instructions to one or more processors for execution. Merely by way of example, the instructions may initially be carried on a magnetic disk and/or optical disc of a remote computer. A remote computer might load the instructions into its dynamic memory and send the instructions as signals over a transmission medium to be received and/or executed by a computer system.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, some operations may be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform one or more of the described tasks.

Components, functional or otherwise, shown in the figures and/or discussed herein as being connected, coupled (e.g., communicatively coupled), or communicating with each other are operably coupled. That is, they may be directly or indirectly, wired and/or wirelessly, connected to enable signal transmission between them.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of operations may be undertaken before, during, or after the above elements are considered. Accordingly, the above description does not bound the scope of the claims.

"About" and/or "approximately" as used herein when referring to a measurable value such as an amount, a temporal duration, and the like, encompasses variations of ±20% or ±10%, ±5%, or +0.1% from the specified value, as appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as appropriate in the context of the systems, devices, circuits, methods, and other implementations described herein.

Further, more than one invention may be disclosed.

What is claimed is:

1. An antenna system, comprising:
   a first radiator operably coupled to a first amplifier;
   a first modulator operably coupled to the first amplifier and configured to provide a first radio frequency signal to the first amplifier;
   a first digital signal processor module operably coupled to the first modulator and configured to provide a first digital signal to the first modulator;
   a second radiator operably coupled to a second amplifier;
   a second modulator operably coupled to the second amplifier and configured to provide a second radio frequency signal to the second amplifier;
   a second digital signal processor module operably coupled to the second modulator and configured to provide a second digital signal to the second modulator;
   a control module operably coupled to the first digital signal processor, the second digital signal processor, the first modulator, first amplifier, the second modulator, and the second amplifier, the control module being configured to:
      control a delta phase value based on the first radio frequency signal and the second radio frequency signal; and
      control the power output of the first amplifier and the second amplifier.

2. The antenna system of claim 1 wherein the first radiator is an E-cylinder and the second radiator is a D-plate.

3. The antenna system of claim 1 wherein the delta phase value is approximately 90 degrees.

4. The antenna system of claim 1 further comprising at least one far field sensor configured to provide far field signal information to the control module.

5. The antenna system of claim 4 wherein the far field signal information is an E-field signal strength measurement.

6. The antenna system of claim 4 wherein the far field signal information is an H-field signal strength measurement.

7. The antenna system of claim 4 wherein the at least one far field sensor is configured to provide at least one environmental variable value.

8. The antenna system of claim 1 further comprising:
   a third radiator operably coupled to a third amplifier;
   a third modulator operably coupled to the third amplifier and configured to provide a third radio frequency signal to the third amplifier;
   a third digital signal processor module operably coupled to the third modulator and configured to provide a third digital signal to the third modulator;
   the control module being operably coupled to third digital signal processor, the third modulator and the third amplifier, and configured to control the power output and the relative phase of the third amplifier.

* * * * *